(12) United States Patent
Chen et al.

(10) Patent No.: US 6,683,815 B1
(45) Date of Patent: Jan. 27, 2004

(54) MAGNETIC MEMORY CELL AND METHOD FOR ASSIGNING TUNABLE WRITING CURRENTS

(75) Inventors: Eugene Y. Chen, Fremont, CA (US); Kamel A. Ounadjela, Belmont, CA (US); Ashish Pancholy, Milpitas, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/180,695

(22) Filed: Jun. 26, 2002

(51) Int. Cl.⁷ .................................................. G11C 7/00
(52) U.S. Cl. ....................... 365/225.5; 365/173; 365/158
(58) Field of Search ............................. 365/225.5, 173, 365/158

(56) References Cited

U.S. PATENT DOCUMENTS

| | | | | |
|---|---|---|---|---|
| 6,111,783 A | * | 8/2000 | Tran et al. | 365/171 |
| 6,233,172 B1 | | 5/2001 | Chen et al. | 365/173 |
| 6,292,389 B1 | | 9/2001 | Chen et al. | 365/158 |
| 6,404,674 B1 | * | 6/2002 | Anthony et al. | 365/173 |
| 6,538,917 B1 | * | 3/2003 | Tran et al. | 365/158 |
| 6,538,920 B2 | * | 3/2003 | Sharma et al. | 365/171 |
| 6,538,921 B2 | * | 3/2003 | Daughton et al. | 365/171 |
| 6,545,906 B1 | * | 4/2003 | Savtchenko et al. | 365/158 |

* cited by examiner

Primary Examiner—Michael S. Lebentritt
Assistant Examiner—Tuan T. Nguyen
(74) Attorney, Agent, or Firm—Kevin L. Daffer; Conley Rose P.C.

(57) ABSTRACT

A circuit is provided herein, which is adapted to supply different current magnitudes along opposing directions of a conductive line. Such a circuit may be particularly beneficial in compensating for the effects of unintentional magnetic coupling within MRAM devices. In addition, a method is provided herein for configuring a device having a magnetic memory array, which receives a first current magnitude along one direction and a substantially different current magnitude along an opposite direction of the magnetic memory array. Furthermore, a method is provided herein which assigns tunable current magnitudes for write operations along conductive lines of a memory circuit. Such tunable writing currents advantageously increase the write selectivity of the memory circuit. More specifically, the tunable writing currents compensate for ferromagnetic and antiferromagnetic coupling within magnetic memory cells caused by uneven surface topology and non-zero total magnetic moments, respectively.

21 Claims, 6 Drawing Sheets

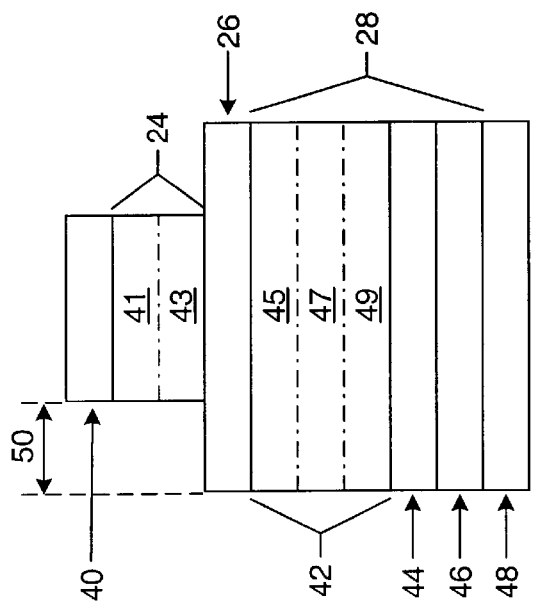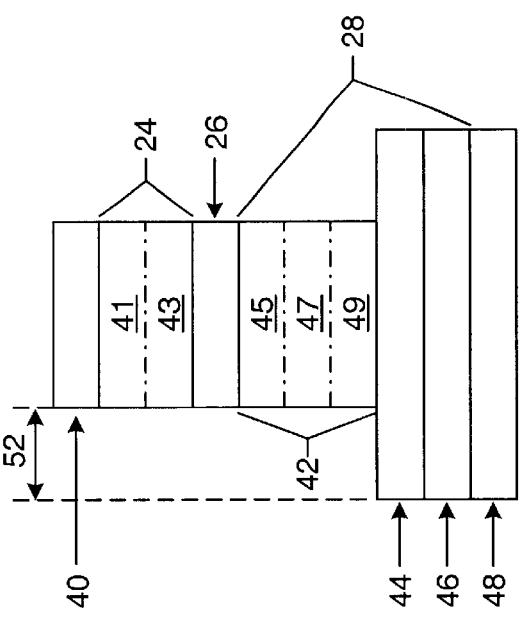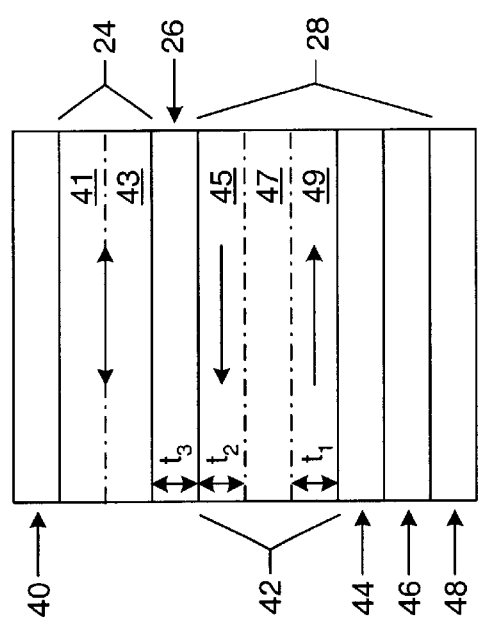

MAGNETIC MEMORY CELL AND METHOD FOR ASSIGNING TUNABLE WRITING CURRENTS

BACKGROUND OF THE INVENTION

1. Field of the Invention

This invention relates to magnetic memory devices and, more particularly, to a circuit and method for providing tunable writing current magnitudes to the magnetic memory devices within a magnetic memory circuit.

2. Description of the Related Art

The following descriptions and examples are given as background information only.

Recently, advancements in the use of magneto-resistive materials have progressed the development of magnetic random access memory (MRAM) devices to function as viable non-volatile memory circuits. In general, MRAM devices exploit the electromagnetic properties of magneto-resistive materials to set and maintain information stored within the individual memory cells of the circuit. In particular, MRAM circuits utilize magnetic direction to store information within a memory cell, and differential resistance measurements to read information from the memory cell. More specifically, information is stored within an MRAM cell as a magnetic bit, the state of which is indicated by the magnetic moment direction within one layer of the memory cell relative to another layer of the memory cell. For example, information may be stored within an upper layer as either a parallel or antiparallel magnetic moment direction relative to a magnetic moment direction of a lower magnetic layer. Note that the term antiparallel is used herein to describe a magnetic moment direction oriented 180° from the magnetic moment direction of the lower magnetic layer. In addition, a differential resistance can be measured between layers of the memory cell. Such a differential resistance indicates a difference in the magnetic moment directions between layers of the memory cell, and thus, can be used to read the magnetic state of the bit stored within the memory cell.

In order for a magnetic element to operate as a memory cell, it must be adapted to maintain two substantially different resistance states (i.e., representing two different magnetic states). It may be preferred, however, that a magnetic memory cell be adapted to maintain two substantially different resistance states at rest (i.e., when substantially no external magnetic field is applied to the cell). Such a magnetic memory cell may need substantially less operating current than a memory cell not adapted to maintain different magnetic states at rest.

More specifically, it is desirable that a magnetic memory cell is adapted to maintain either a parallel or an antiparallel magnetic state at rest. Such a case may be equivalent to having a nearly centered resistance (R) versus magnetic field (or, applied current, I) response, such as the R-I curve illustrated in FIG. 2A. In other words, optimum MRAM operation usually exhibits a nearly centered resistance versus applied current response, and thus, allows substantially equal thresholds of writing current to switch the magnetic state of the memory cell from a low resistance state to a high resistance state, and vice versa. As such, FIG. 2A depicts an ideal response in which the magnitude of current ($|I_1|$) needed to switch the magnetization from a low to high resistance state is substantially equal to the magnitude of current ($|I_2|$) needed to switch the magnetization from a high to low resistance state. In addition, a magnetic memory cell demonstrating a nearly centered R-I curve can maintain two substantially different magnetic states (reference numerals 32a and 32b) at rest.

However, the R-I curve may be significantly affected by variations within and/or between individual memory cells of an MRAM circuit. As such, it is not typical that all memory cells within the MRAM circuit exhibit such a nearly centered R-I curve. Instead, a portion of the memory cells within the circuit may demonstrate an offset in the R-I curve. In some cases, the offset may be such that two substantially different magnetic states can be maintained at rest. Such an offset, however, may introduce unequal thresholds of writing current between the two magnetic states, thereby requiring substantially more current to switch one magnetic state versus the other. In other cases, however, the offset may be such that only one magnetic state can be maintained at rest. An offset of such a degree typically results in false write operations, thereby indicating failure of the memory device to store accurate information.

In some cases, the R-I curve may be significantly affected by variations within individual memory cells that cause ferromagnetic coupling between layers of the cells. During fabrication of MRAM cells, for example, individual cell layers may be fabricated having surfaces that are not completely flat but instead exhibit surface and/or interface roughness. Such variation in surface topology causes the formation of magnetic poles along an interface between two or more layers of the MRAM cell. In this manner, interface roughness causes unintentional magnetic coupling of the magnetic poles formed along the interface. Such unintentional magnetic coupling tends to introduce an offset into the R-I curve by forcing the magnetic moments of the two or more cell layers to point along a single direction. Therefore, such unintentional magnetic coupling may be referred to as ferromagnetic or positive coupling. Note, however, that ferromagnetic coupling typically produces an offset in the same direction as the direction of current (I) flow along the width of the memory cell that causes a high resistance state in the memory cell. For example, ferromagnetic coupling may introduce a positive offset into the R-I curve if the direction of current flow along the width of the memory cell is in a positive direction.

In other cases, an offset may be introduced into the R-I curve on account of antiferromagnetic coupling. Antiferromagnetic coupling generally refers to the unintentional magnetic coupling between an upper magnetic layer, which stores memory information, and the ends of one or more lower magnetic layers, which have magnetic moments fixed in a particular direction. As such, an offset may be introduced into the R-I curve when the combined magnetic moments of the one or more lower magnetic layers are non-zero. In this case, such unintentional magnetic coupling introduces an offset into the R-I curve by forcing the magnetic moments of the upper and lower magnetic layers to point along substantially opposite directions. This offset, termed negative offset, is generally along the same direction as the direction of current (I) flow along the width of a memory cell that causes a low resistance state in the memory cell. Thus, such unintentional magnetic coupling is generally referred to as antiferromagnetic or negative coupling.

Any offset (positive or negative), however, may produce unequal thresholds of writing current, such that substantially more current is needed to write one magnetic state versus another magnetic state within an individual memory cell. Such unequal thresholds of writing current may cause a false write operation to occur in one or more memory cells of the MRAM circuit, thereby causing the memory device to store inaccurate information.

As stated above, it is desirable for a magnetic memory cell to maintain two substantially different magnetic states at rest. In some embodiments, however, unintentional ferromagnetic coupling may introduce a positive offset so severe that only one magnetic state, such as the low resistance state, can be maintained when no external magnetic field is applied. In FIG. 2B, for example, the positive offset introduced into the R-I curve may be so large that only a low resistance state (reference numeral 34) is maintained when no external magnetic field is applied (i.e., when the applied current, I, is substantially zero). In such a case, a biasing magnetic field (and thus, a biasing current) may be needed to maintain a high resistance state in the presence of unintentional ferromagnetic magnetic coupling.

In other embodiments, unintentional antiferromagnetic coupling may introduce a negative offset so severe that only one magnetic state, such as a high resistance state, can be maintained when no external magnetic field is applied. In FIG. 2C, for example, the negative offset introduced into the R-I curve may be so large that only a high resistance state (reference numeral 36) is maintained when no external magnetic field is applied. In such a case, a biasing magnetic field (and thus, a biasing current) may be needed to maintain a low resistance state in the presence of unintentional antiferromagnetic magnetic coupling.

In either embodiment of FIG. 2B or 2C, ferromagnetic and/or antiferromagnetic coupling generally causes failure of the MRAM circuit without the application of a biasing magnetic field. Such failure is typically due to the inability of one or more memory cells to maintain two substantially different magnetic states at rest. The application of such a biasing magnetic field, however, generally causes an undesirable increase in the power consumed by the MRAM circuit.

Therefore, it would be advantageous to develop a magnetic memory circuit that overcomes the problems described above. In general, it would be advantageous to provide a magnetic memory circuit, which is unaffected by unintentional magnetic coupling, such as ferromagnetic and antiferromagnetic coupling. In particular, it would be advantageous to provide a magnetic memory circuit and method of construction that substantially eliminates the occurrence of false write operations within individual cells of the magnetic memory circuit. In this manner, the amount of power consumed by a memory circuit may be reduced, as compared to a memory circuit that does not compensate for unintentional magnetic coupling.

SUMMARY OF THE INVENTION

The problems outlined above may be in large part addressed by a circuit adapted to supply different current magnitudes along opposing directions of a conductive line. Such a circuit may be particularly beneficial in compensating for the effects of unintentional magnetic coupling, such as ferromagnetic and antiferromagnetic coupling, within MRAM devices. In addition, a method is provided herein which determines tunable write current magnitudes for conductive lines arranged within a circuit. In one example, the tunable writing currents advantageously increase the current margin between select and disturb cells (i.e., increase the write selectivity), to thereby decrease the probability of storing inaccurate information within the memory circuit. More specifically, the tunable writing currents may compensate for ferromagnetic and antiferromagnetic coupling within magnetic memory cells caused by uneven surface topology and non-zero total magnetic moments of the fixed magnetic layers, respectively. In addition, the tunable writing currents may compensate for variations in cell fabrication processes, such as overlay variations produced in the masking and etching processes.

As stated above, a circuit is provided which is adapted to supply current at a first magnitude along one direction of a conductive line arranged within the circuit. In addition, the circuit is adapted to supply current at a second magnitude along an opposite direction of the conductive line. In some embodiments, the circuit may also supply the first and second current magnitudes to a plurality of other conductive lines aligned with the conductive line. In some cases, the conductive line is a bit line, such that current may be supplied along a direction and an opposite direction of the bit line. In other cases, however, the conductive line is a digit line, such that current may be supplied along one direction and an opposite direction of the digit line. In any case, the first and second current magnitudes may be substantially different. Such a difference may advantageously compensate for a non-centered resistance versus current response, which may be produced by unintentional magnetic coupling within individual memory cells of the circuit. As such, the circuit provided herein may demonstrate an increased selectivity for write operations in memory cells, which exhibit non-centered resistance versus current responses.

In some cases, the circuit provided herein may exhibit a write selectivity having a current margin equal to or greater than approximately 0.8 mA. In particular, the circuit may exhibit a write selectivity having a current margin between about 0.8 mA and about 2.5 mA. The current margin, as described herein, is the difference between a minimum current value needed to switch a disturbed memory cell and a maximum current value needed to switch a selected memory cell. The maximum current value may be described as the amount of current supplied to one or more parallel conductive lines, which induces a magnetic field strong enough to switch the magnetic direction of substantially all selected memory cells arranged along the one or more parallel conductive lines. Alternatively, the minimum current value may be described as the amount of current supplied to one or more parallel conductive lines, which induces a magnetic field strong enough to switch the magnetic direction of at least one disturbed memory cell arranged along the one or more parallel conductive lines.

In addition, the circuit provided herein may include at least one magnetic memory cell. Such a magnetic memory cell may be adapted to maintain a first magnetic direction within a first magnetic layer of the memory cell. In some cases, the first magnetic layer may be referred to as a pinned magnetic layer, such that the magnetic moment or magnetization of the layer is "pinned" in a predefined or reference direction. Furthermore, the magnetic memory cell of the circuit may be adapted to maintain a second magnetic direction within a second magnetic layer of the memory cell. In such an embodiment, the second magnetic layer may be referred to as a fixed magnetic layer, such that the magnetization of the layer is "fixed" in a second magnetic direction, which is opposite to the first magnetic direction. Moreover, the magnetic memory cell of the circuit may be adapted to alter a third magnetic direction within a third magnetic layer of the magnetic memory cell. Such a third magnetic layer may be referred to as a free or soft magnetic layer, in some embodiments, such that the magnetization of the layer is "free" to switch between same and opposite magnetic directions relative to the reference magnetic direction of the first magnetic layer.

Furthermore, the magnetic memory cell may include a relatively thin, nonmagnetic coupling layer, which may separate the first and second magnetic layers of a magnetic memory cell to create a synthetic antiferromagnetic stack ("SAF"). In this manner, the SAF is referred to as "balanced" when the first and second magnetic layers include substantially similar thicknesses. Alternatively, the SAF is "unbalanced" when the first and second magnetic layers include substantially different thicknesses. As such, the circuit provided herein may exhibit increased write selectivity for magnetic memory cells having balanced or unbalanced SAF stacks.

Moreover, the magnetic memory cell may include an upper portion and a lower portion, such that the upper portion demonstrates a narrower width than the lower portion. In some cases, the upper portion includes the third and second magnetic layers while the lower portion includes the first magnetic layer. In other cases, however, it may be desired that the upper portion includes the third magnetic layer while the lower portion includes the first and second magnetic layers. In such a case, the third magnetic layer exhibits a narrower width than the widths of the first and second magnetic layers. In this manner, decreasing the width of the third magnetic layer tends to reduce the occurrence of electrical shorting across a spacer layer (i.e., tunnel barrier layer) arranged between the third magnetic layer and the second magnetic layer. The third magnetic layer, however, is typically patterned during a separate processing step than the patterning process of the lower portion. As such, variations in the separate processing step may cause the third magnetic layer to be formed overlying the lower portion in a position, which may vary from cell to cell (i.e., overlay variation). As will be described in more detail below, the circuit may compensate for such overlay variations by supplying writing currents having variable magnitudes (i.e., tunable writing currents).

In another embodiment, a method is provided herein for configuring a device having a magnetic memory array, such as the circuit described above. The method includes configuring the device to receive a first current magnitude along one direction of the magnetic memory array. In some cases, the method further includes configuring the device to receive a second current magnitude along an opposite direction of the magnetic memory array, such that the second current magnitude is substantially different from the first current magnitude. In other cases, however, the method may include configuring the device to receive a second current magnitude, which is substantially equal to the first current magnitude, along the opposite direction of the magnetic memory array. In any case, the first and second current magnitudes include write operation current magnitudes for the magnetic memory array. As such, the method may include configuring the device to receive the first and second current magnitudes along a bit line or, alternatively, along a digit line of the device. Alternatively, the method may include configuring the device to receive the first and second current magnitudes along both a bit line and a digit line of the device. Therefore, the method provides tunable writing currents along either the bit line, the digit line, or along both the bit line and the digit line.

In yet another embodiment, a method is provided herein for assigning tunable write operation current magnitudes to memory cells within a magnetic memory array. In particular, the method includes determining a first write operation current magnitude along a direction of a conductive line arranged within the magnetic memory array. In addition, the method includes separately determining a second write operation current magnitude along an opposite direction of the conductive line. In one example, the first write operation current magnitude may be adapted to switch the magnetic state of a selected memory cell from a parallel to an antiparallel state. As such, the second write operation current magnitude may be adapted to switch the magnetic state of the selected memory cell from an antiparallel to a parallel state. Alternatively, the first write operation current magnitude may be adapted to switch the magnetic state from an antiparallel to a parallel state, whereas the second write operation current magnitude may be adapted to switch the magnetic state from a parallel to an antiparallel state. In some cases, the steps of determining the first and second write operation current magnitudes are conducted consecutively. In other cases, however, the steps of determining the first and second write operation current magnitudes are conducted simultaneously.

In any case, the step of determining the first write operation current magnitude may include applying current along the one direction of the conductive line to determine a first current margin between a write operation current magnitude of a disturbed memory cell and a write operation current magnitude of a selected memory cell. Subsequently, the method may include designating a first current magnitude within the first current margin to be applied along the one direction of the conductive line. In addition, the step of separately determining the second write operation current magnitude may include applying current along the opposite direction of the conductive line to determine a second current margin between a write operation current magnitude of a disturbed memory cell and a write operation current magnitude of a selected memory cell. Subsequently, the method may include designating a second current magnitude within the second current margin to be applied along the opposite direction of the conductive line. As stated above, the first write operation current magnitude may be different than the second write operation current magnitude, in some cases. In other cases, however, the first write operation current magnitude may be substantially equal to the second write operation current magnitude.

BRIEF DESCRIPTION OF THE DRAWINGS

Other objects and advantages of the invention will become apparent upon reading the following detailed description and upon reference to the accompanying drawings in which:

FIG. 3 is a cross-sectional view illustrating an embodiment of a magnetic memory cell as shown in the array of FIG. 1;

FIG. 4 is a cross-sectional view illustrating another embodiment of a magnetic memory cell as shown in the array of FIG. 1;

FIG. 5 is a cross-sectional view illustrating yet another embodiment of a magnetic memory cell as shown in the array of FIG. 1;

Figure 1:
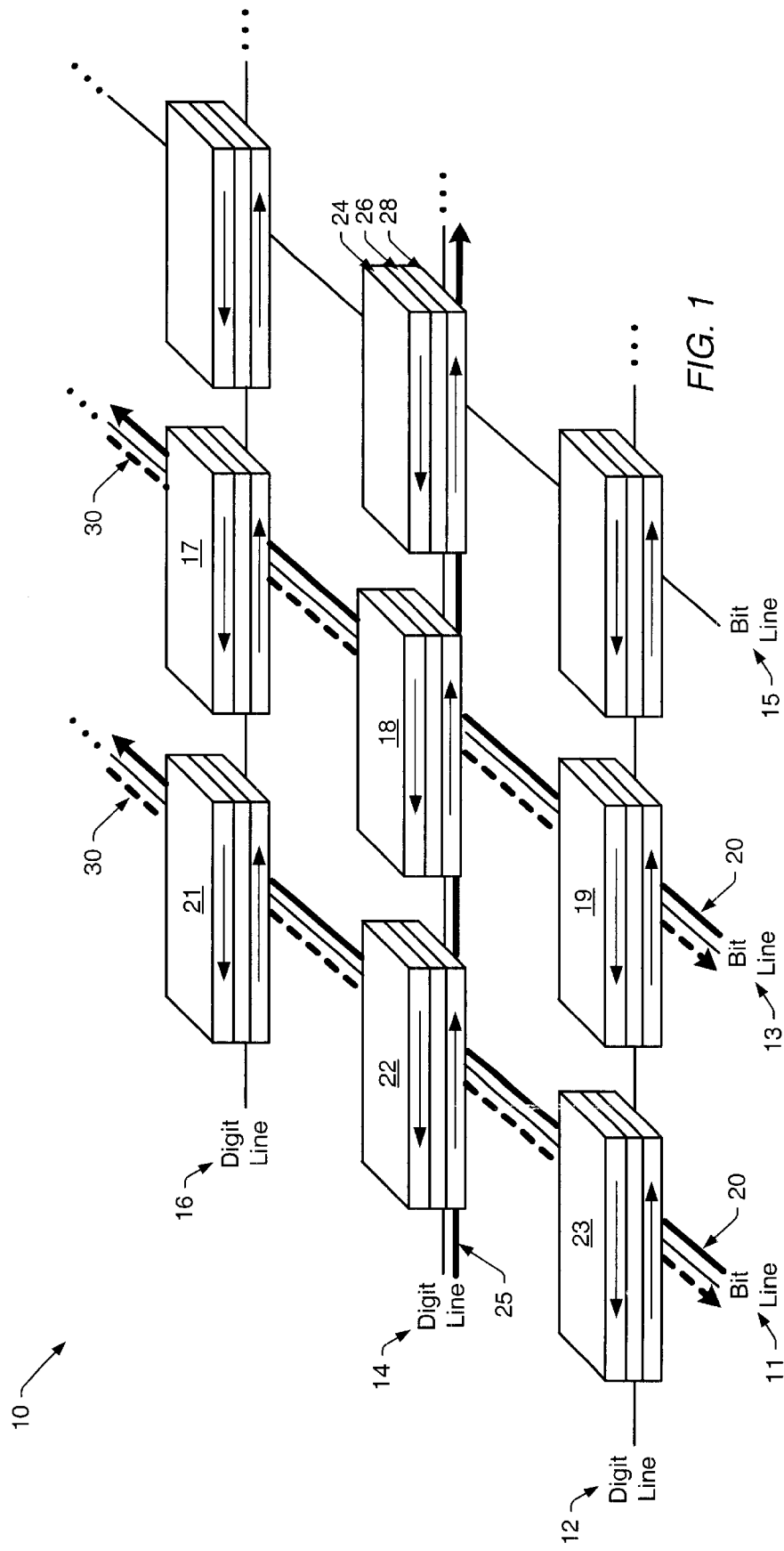
FIG. 1 is a block diagram illustrating a magnetic memory cell array.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates exemplary memory circuit 10 as a magnetic random access memory (MRAM) circuit. In general, MRAM circuit 10 includes a plurality of conductive lines configured for generating magnetic fields. As such, a first set of the plurality of conductive lines is arranged in orthogonal alignment with a second set of the plurality of conductive lines. In some cases, the first set of conductive lines may include bit lines 11, 13, and 15, whereas the second set of conductive lines may include digit lines 12, 14, and 16. MRAM circuit 10 also includes a plurality of MRAM cells, such as cells 17–19 and 21–23, where each of the plurality of MRAM cells is approximately arranged at the overlap points of individual bit lines and digit lines. It is noted that the conductive lines are illustrated as arranged beneath the memory cells to merely simplify the drawing shown in FIG. 1. In reality, the memory cells are typically sandwiched between individual bit lines and digit lines at the overlap points thereof. For example, bit lines may be individually arranged above the plurality of memory cells, whereas digit lines may be individually arranged below the plurality of memory cells. An opposite arrangement, in which digit lines are arranged above and bit lines are arranged below, may be implemented in an alternative memory circuit. In addition, it is noted that the plurality of MRAM cells are illustrated in FIG. 1 as having rectangular shapes for the purpose of drawing clarity only. Instead, the MRAM cells of circuit 10 generally demonstrate a shape having a substantially smooth perimeter. More specifically, one or more layers within the MRAM cells of circuit 10 may demonstrate a shape having a substantially smooth perimeter.

During a write operation, current is applied to a pair of conductive lines (e.g., a selected bit line and a selected digit line) corresponding to a selected MRAM cell. Such an applied current may induce an external magnetic field that "sets" the logic state of the selected MRAM cell. For example, write operation currents applied along bit line 13 and digit line 14 may induce an external magnetic field strong enough to switch the magnetic direction of selected memory cell 18, as described in more detail below. However, a multitude of other memory cells (represented in part by cells 17, 19, and 22) arranged along selected bit line 13 and selected digit line 14 may sense a portion of the magnetic field induced by the write operation current. Because such a portion is typically less than the field strength sensed by the selected memory cell, the multitude of other memory cells is generally referred to as half-selected or disturbed cells. In some cases, the portion of the magnetic field may not be large enough to switch the magnetization of the disturbed cells. In other cases, however, variations in the cell fabrication process (e.g., variations in shape, size, and/or the presence of defects) may cause the portion of the magnetic field to switch the magnetization of the disturbed cells. As such, variations in the cell fabrication process may cause a false write operation to occur in one or more of the disturbed cells, thereby decreasing the write selectivity between individual memory cells of the circuit. The write selectivity, as referred to herein, is the relative difference (i.e., current margin) between the amount of current responsible for switching the magnetic direction of a disturbed memory cell and the amount of current needed to switch the magnetic direction of a selected memory cell.

In addition, an MRAM cell typically includes at least two magnetic layers separated by a non-magnetic layer, as shown in FIG. 1. In one example, lower magnetic layer 28 is usually pinned in a predefined magnetic direction, and thus, is typically referred to as a fixed or pinned magnetic layer. Such a predefined direction usually serves as a reference direction for upper magnetic layer 24. During a write operation, the magnetic direction of upper magnetic layer 24 is free to switch between a parallel or antiparallel direction relative to the reference direction of lower magnetic layer 28. As such, upper magnetic layer 24 is typically referred to as a free magnetic layer or a storage magnetic layer. During a read operation, however, current is applied to only one conductive line (e.g., a bit line), such that electrons residing within upper magnetic layer 24 tunnel through lower magnetic layer 28 via non-magnetic layer 26. In this manner, the electrons tunneling through non-magnetic layer 26 may experience relatively more or less resistance, depending on the individual magnetic directions of magnetic layers 24 and 28. As such, non-magnetic layer 26 is usually referred to as a tunnel barrier layer.

Note, however, that the magnetic memory cells of FIG. 1 are illustrated as having only three cell layers for the sake of drawing clarity. Instead, the memory cells of the circuit shown in FIG. 1 preferably include a plurality of cell layers, such as those illustrated in FIG. 3. As such, FIG. 3 is a cross-sectional view of an exemplary magnetic memory cell, such as an MRAM cell. In some cases, lower magnetic layer 28 may include a plurality of cell layers, such as pinned ferromagnetic layer 49, antiferromagnetic layer 44 and seed layer 46. In other cases, however, it may be desired that lower magnetic layer 28 further include fixed ferromagnetic layer 45 and coupling layer 47, such that layers 45 and 47 are arranged between tunnel barrier layer 26 and pinned ferromagnetic layer 49. In such a case, fixed ferromagnetic layer 45, coupling layer 47, and pinned ferromagnetic layer 49 are generally referred to as a synthetic antiferromagnetic ("SAF") stack 42, the advantages of which will be discussed in more detail below.

As stated above, a pinned magnetic layer of a magnetic memory cell is described as having a magnetization that is "pinned" in a predefined or reference direction. Such magnetic pinning is typically due to a strong exchange interaction at the interface between pinned ferromagnetic layer 49 and antiferromagnetic layer 44. Exchange interaction is a quantum mechanical atomic attraction force between nearest neighboring atoms as a result of shared electron clouds. Antiferromagnetic layer 44 is generally formed of antiferromagnetic materials, or a class of magnetic materials having neighboring spins pointing in opposite directions. In this manner, antiferromagnetic layer 44 generally exhibits a near zero total magnetic moment. On the other hand, pinned ferromagnetic layer 49 is generally formed of ferromagnetic materials, or magnetic materials that do exhibit a strong magnetic moment in a particular direction. Therefore, to strengthen the "pinned" magnetic field direction, pinned ferromagnetic layer 49 may be formed upon and coupled to a surface (e.g., the uppermost surface) of antiferromagnetic layer 44. As such, the magnetic exchange coupling between layers 44 and 49 produces a pinned magnetic field within pinned ferromagnetic layer 49 having a direction that strongly resists rotation in the presence of an applied magnetic field large enough to rotate the magnetic direction of free magnetic layer 24.

In some cases, antiferromagnetic layer 44 may be formed of one or more alloys including, but not limited to, iridium (Ir), platinum (Pt), or manganese (Mn). For example, antiferromagnetic layer 44 may be formed of iridium manganese (IrMn) or platinum manganese (PtMn). In some cases, pinned ferromagnetic layer 49 may be formed of one or more alloys including, but not limited to, nickel (Ni), iron (Fe) and cobalt (Co). Preferably, pinned ferromagnetic layer 49 may be formed of cobalt and iron so as to obtain a substantially high magnetization value to match the magnetization of fixed ferromagnetic layer 45. In addition, seed layer 46 may be formed of substantially any material composition that further aids in aligning the crystalline structure of antiferromagnetic layer 44. For example, seed layer 46 may be formed of ruthenium (Ru), copper (Cu), or an alloy including nickel (Ni), iron (Fe), and/or chromium (Cr).

Furthermore, coupling layer 47 is generally arranged upon the uppermost surface of pinned ferromagnetic layer 49 and is typically formed of a material, which induces exchange coupling between pinned ferromagnetic layer 49 and fixed ferromagnetic layer 45. For example, coupling layer 47 may be formed of a material, such as ruthenium (Ru). In other words, coupling layer 47 is arranged between layers 45 and 49 to induce a "fixed" magnetic direction within fixed ferromagnetic layer 45 that is substantially opposite to the "pinned" magnetic direction of pinned ferromagnetic layer 49. As such, fixed ferromagnetic layer 45 is generally included within SAF stack 42 to avoid a strong magnetic fringe field on free magnetic layer 24 from the ends of pinning layers 44 and 49. In other words, fixed magnetic layer 45 is generally included to ensure that the presence of pinning layers 44 and 49 does not greatly influence the switching behavior of free magnetic layer 24.

In addition, fixed ferromagnetic layer 45 may be included within SAF stack 42 to increase the effective pinning field strength of the magnetic memory cell. In general, the effective pinning field strength is inversely proportional to the difference between the thickness of fixed ferromagnetic layer 45 and the thickness of pinned ferromagnetic layer 49. Such a difference in layer thickness is usually referred to as the effective magnetic layer thickness. In this manner, layer 45 is typically included to reduce the effective magnetic layer thickness to thereby increase the effective pinning field strength of the memory cell. As such, the effective pinning field strength generally increases as the effective magnetic layer thickness decreases. Similar to pinned ferromagnetic layer 49, fixed ferromagnetic layer 45 may be formed of one or more alloys including, but not limited to, nickel (Ni), iron (Fe) and cobalt (Co). Preferably, fixed ferromagnetic layer 45 may be formed of cobalt and iron to achieve a high magnetization or spin polarization value, and thus obtain a higher magneto-resistance between free ferromagnetic layer 24 and fixed ferromagnetic layer 45 (i.e., to obtain a higher change in resistance during a read operation).

Furthermore, although FIG. 3 illustrates a magnetic memory cell having only one cell layer within fixed ferromagnetic layer 45, any number of cell layers may alternatively be included. In particular, fixed ferromagnetic layer 45 may include a plurality of ferromagnetic layers, which are arranged between tunnel barrier layer 26 and coupling layer 47. More specifically, a coupling layer, such as a layer of ruthenium (Ru), may separate each of the plurality of ferromagnetic layers within fixed ferromagnetic layer 45, such that neighboring ferromagnetic layers may have magnetic moments, which are fixed in opposing directions. For example, fixed ferromagnetic layer 45 may include a first ferromagnetic layer formed upon a first coupling layer. Such a first coupling layer may be formed upon a second ferromagnetic layer, which in turn, is formed upon coupling layer 47. In such an example, the first and second ferromagnetic layers may exhibit magnetic moments, which are fixed in opposing directions, due to the inclusion of the first coupling layer.

Moreover, a number of other cell layers may be included within a magnetic memory cell, as shown in FIG. 3. For example, the magnetic memory cell may include top metal layer 40 and bottom metal layer 48, constituting a top and bottom electrode, respectively. As such, top electrode 40 and bottom electrode 48 are usually formed of metals, such as aluminum (Al), copper (Cu), tantalum (Ta), titanium (Ti), tungsten (W), or an alloy thereof, such as a titanium tungsten alloy (TiW). However electrodes 40 and 48 are not limited to such metals, and may be formed of any material that exhibits a relatively high conductivity.

In addition, free magnetic layer 24, typically formed of ferromagnetic materials, may include one or more cell layers having one or more material compositions. Although FIG. 3 illustrates a magnetic memory cell having two layers within free magnetic layer 24, any number of layers may alternatively be included. For example, free ferromagnetic layer 24 may include only one cell layer having only one material composition, or alternatively, may include three cell layers having three substantially different material compositions. For the sake of simplicity, however, the magnetic memory cell will be described herein as having two cell layers within free magnetic layer 24.

For example, free magnetic layer 24 may be formed including first layer 41 and second layer 43. In some cases, first layer 41 may be formed of an alloy including nickel (Ni) and iron (Fe). In addition, second layer 43 may be formed an alloy including cobalt (Co) and iron (Fe). In this manner, first layer 41 is generally formed having a relatively low magnetization, whereas second layer 43 is generally formed having a relatively high magnetization. As such, second layer 43 may be arranged adjacent to tunnel barrier layer 26 to achieve a substantially higher magneto-resistance value between free ferromagnetic layer 24 and fixed ferromagnetic layer 45. Furthermore, although first layer 41 is formed having a substantially lower magnetization than second layer 43 (due to their respective material compositions), the combination of first layer 41 and second layer 43 demonstrates a magneto-resistance that is substantially equal to the high magneto-resistance of second layer 43.

High magnetization materials (e.g., the material composition of second layer 43), however, undesirably demonstrate significantly higher switching fields than low magnetization materials (e.g., the material composition of first layer 41). Therefore, first layer 41 may be formed upon a surface (e.g., an uppermost surface) of second layer 43 to modify the switching field of free ferromagnetic layer 24. In other words, since first layer 41 has a relatively lower switching field than second layer 43 (due to their respective material compositions), first layer 41 may be formed above second layer 43, such that a write operation current applied to a conductive line above the memory cell may store information easier within first layer 41 as opposed to second layer 43. As such, the combination of first layer 41 and second layer 43 may reduce the overall switching field of free ferromagnetic layer 24. Such a reduction of the switching field may enable the memory cell to be switched easier than a memory cell, for example, having only one layer such as layer 43. Note, however, that the material compositions of the one or more cell layers within free magnetic layer 24 are not restricted to the compositions described herein. Instead, the one or more cell layers of free magnetic layer 24 may be formed of any ferromagnetic materials, and may have substantially the same or different material compositions.

In general, a bit of information may be written to an MRAM cell by applying current that induces a magnetic field external to the cell. Such an external magnetic field may force a majority of the internal magnetic field vectors within free ferromagnetic layer 24 to align in a direction, either parallel or antiparallel, relative to the reference magnetic direction of pinned ferromagnetic layer 49. Thus, the magnetic state of the stored bit is determined by the variable magnetic direction of free ferromagnetic layer 24. In addition, a bit stored within an MRAM cell may be read by measuring the resistance between the upper and lower magnetic layers of the MRAM cell. As such, a relatively higher value of resistance may indicate an antiparallel magnetic state, whereas a relatively lower value of resistance may indicate a parallel magnetic state. Once the bit is stored, however, the current is preferably discontinued without losing or altering the magnetic state of the stored bit.

Alternatively, the magnetic state of the stored bit may be altered once current is removed from the circuit due to unintentional magnetic coupling between layers of the magnetic memory cell. In some cases, unintentional magnetic coupling may cause the magnetic state of a selected memory cell to undesirably switch from an antiparallel to a parallel direction when current is removed from the selected bit line and/or the selected digit line. In other cases, removal of current may allow unintentional magnetic coupling to undesirably switch the magnetic state of the selected memory cell from a parallel magnetic state to an antiparallel magnetic state. In any case, unintentional magnetic coupling may interfere with the operation of the memory circuit. For example, unintentional magnetic coupling may cause a slight reduction in write selectivity between individual memory cells of the circuit. However, unintentional magnetic coupling may be so severe that false write operations occur in one or more memory cells, thereby storing inaccurate information.

In one example, unintentional magnetic coupling may be produced due to variations in the cell fabrication process. In particular, individual cell layers may be fabricated having surfaces, which are not completely flat, but instead exhibit surface and/or interface roughness. As stated above, such variation in surface topology may cause magnetic poles to form along an interface between two or more layers of the memory cell, such as free ferromagnetic layer 24 and fixed ferromagnetic layer 45 (or, pinned ferromagnetic layer 49 if one or more cell layers of SAF stack 42 are not included). In this manner, an offset may be introduced into the R-I curve due to unintentional magnetic coupling of the magnetic poles along the lowermost surface of free layer 24 and the uppermost surface of fixed layer 45. As stated above, such unintentional magnetic coupling generally introduces a positive offset into the R-I curve by forcing the magnetic moments of the two or more cell layers to point along a single direction. Therefore, such unintentional magnetic coupling is generally referred to as ferromagnetic or positive coupling.

Figure 2A:
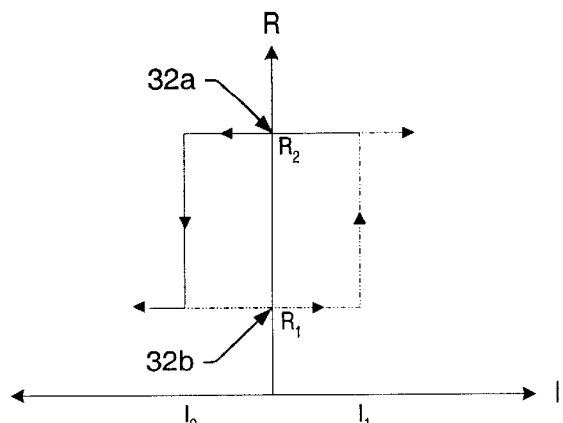
FIG. 2A is a graph illustrating a substantially centered resistance versus applied current response.
Figure 2B:
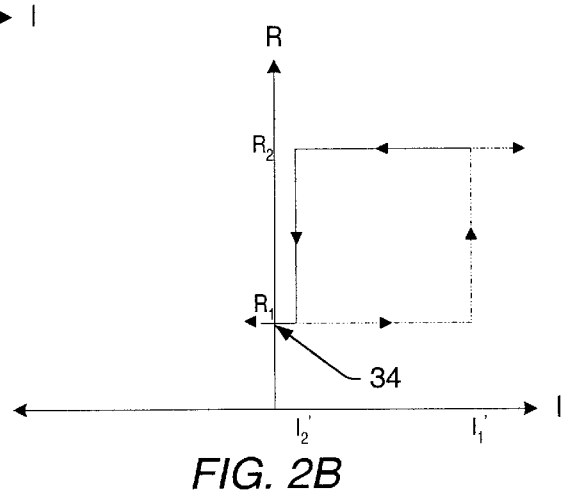
FIG. 2B is a graph illustrating a positive offset introduced into the resistance versus applied current response.

As noted above, optimum MRAM operation generally demonstrates a centered resistance versus magnetic field (or current) response. A magnetic memory cell affected by ferromagnetic coupling, however, may need a relatively higher magnitude of current to switch from a low to high resistance state than from a high to low resistance state. FIG. 2B illustrates the case in which the magnitude of current ($|I_1'|$) needed to switch the magnetization of a memory cell from a low to high resistance state is significantly greater than the magnitude of current ($|I_2'|$) needed to switch the magnetization from a high to low resistance state. In this manner, ferromagnetic coupling may introduce a positive offset into the R-I curve, thereby producing unequal thresholds of writing current between the two magnetic states and reducing the write selectivity between select and disturbed memory cells within a magnetic memory circuit. As such, ferromagnetic coupling may cause a false write operation to occur in one or more disturbed memory cells. The writing of false bits, however, is undesirable and indicates failure of the memory device to store accurate information.

Figure 2C:
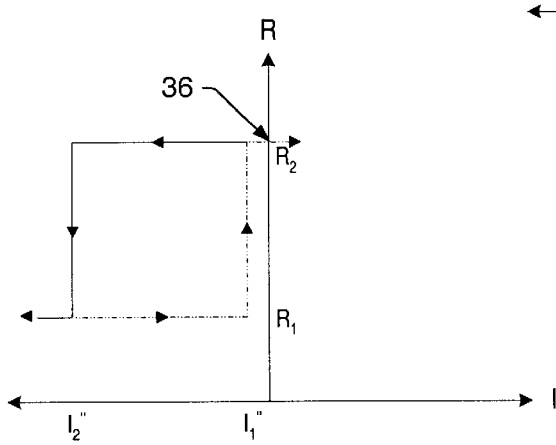
FIG. 2C is a graph illustrating a negative offset introduced into the resistance versus applied current response.

In another example, unintentional magnetic coupling may be produced by magnetic coupling between free magnetic layer 24 and the ends of fixed ferromagnetic layer 45 and pinned ferromagnetic layer 49. Such unintentional magnetic coupling is generally referred to as a "magneto-static interaction" or a "magnetic fringe field." As such, an offset may be introduced into the R-I curve when the magnetic fringe field between free magnetic layer 24 and the ends of layers 45 and 49 demonstrates a non-zero total magnetic moment. In some cases, for example, fixed layer 45 may have a relatively lower magnetic moment than the magnetic moment of pinned layer 49, such that the net effect of the magnetic fringe field is a positive shift in the R-I curve (e.g., as shown in FIG. 2B). In other cases, however, fixed layer 45 may have a relatively higher magnetic moment than the magnetic moment of pinned layer 49, such that the net effect of the magnetic fringe field is a negative shift in the R-I curve (e.g., as shown in FIG. 2C). In any case, such unintentional magnetic coupling may introduce an offset (either positive or negative) into the R-I curve by forcing the magnetic moments of free magnetic layer 24 and fixed magnetic layer 45 to point in substantially opposite directions. For this reason, such unintentional magnetic coupling is generally referred to as antiferromagnetic or negative coupling.

For the sake of simplicity, antiferromagnetic coupling will be discussed in more detail below as producing a negative offset in the R-I curve, such as the offset shown in FIG. 2C. In other words, FIG. 2C illustrates the case in which the magnitude of current ($|I_1''|$) needed to switch the magnetization from a low to high resistance state is significantly less than the magnitude of current ($|I_2''|$) needed to switch the magnetization from a high to low resistance state. In this manner, antiferromagnetic coupling may introduce a negative offset into the R-I curve, thereby producing unequal thresholds of writing current between the two magnetic states, and requiring substantially more current to switch one magnetic state versus the other. Therefore, antiferromagnetic coupling generally reduces the write selectivity between select and disturbed memory cells within a magnetic memory circuit and, in some cases, may cause a false write operation to occur in one or more disturbed memory cells. As noted above, however, the writing of false bits is undesirable and indicates failure of the memory device to store accurate information.

In addition, it is noted that for a magnetic element to operate as a memory cell, the element must be able to attain two substantially different magnetic states. In some cases, it may be preferred that a magnetic memory cell be further adapted to maintain two substantially different resistance states when no external magnetic field is applied. However, the presence of unintentional magnetic coupling may allow only one magnetic state to be maintained when no external magnetic field is applied. For example, ferromagnetic coupling may allow only a low resistance state (e.g., reference numeral 34 of FIG. 2B) to be maintained at rest. As such, a biasing magnetic field may be needed to maintain a high resistance state in the presence of ferromagnetic coupling. In another example, antiferromagnetic coupling may allow only a high resistance state (e.g., reference numeral 36 of FIG. 2C) to be maintained at rest. As such, another biasing magnetic field may be needed to maintain a low resistance state in the presence of antiferromagnetic coupling. If a biasing magnetic field is not provided, the magnetic state of the stored bit may be altered once current is removed from the circuit, thereby resulting in substantially no difference in readout signal between opposing memory states. Therefore, unintentional magnetic coupling may cause the MRAM circuit to fail in the absence of a biasing magnetic field. Unfortunately, the application of a biasing magnetic field, undesirably increases the amount of power consumed by the MRAM circuit.

Therefore, it may be advantageous to provide a magnetic memory cell that reduces unintentional magnetic coupling, such as ferromagnetic and antiferromagnetic coupling. Preferably, such a magnetic memory cell would increase the write selectivity between individual memory cells (thereby reducing the occurrence of false write operations) and maintain proper operating characteristics when power is removed from the circuit. FIG. 3 illustrates one approach in which ferromagnetic coupling may be reduced by including one or more additional layers within the lower portion of the memory cell. More specifically, FIG. 3 illustrates one embodiment of a memory cell including additional layers, such as fixed ferromagnetic layer 45 and coupling layer 47, within synthetic antiferromagnetic ("SAF") stack 42. In general, the additional layers may be included within SAF stack 42 to induce a biasing magnetic field having a direction substantially opposite to the magnetic field direction of pinned ferromagnetic layer 49. As such, the biasing magnetic field may attempt to re-center the resistance verses magnetic field response to compensate for ferromagnetic coupling. In this manner, SAF stack 42 may attempt to compensate for ferromagnetic coupling by providing a substantially higher magnetic fringe field from fixed ferromagnetic layer 45 than from pinned ferromagnetic layer 49.

As noted above, ferromagnetic coupling may also be due to positive coupling between free ferromagnetic layer 24 and fixed ferromagnetic layer 45. Therefore, another approach to compensating for ferromagnetic coupling is to vary the thickness of one or more cell layers within SAF stack 42. Referring to FIG. 3, for example, pinned ferromagnetic layer 49 may have a thickness, $t_1$, which is generally less than approximately 100 angstroms. In addition, fixed ferromagnetic layer 45 may have a thickness, $t_2$, within a range of approximately 3 angstroms to approximately 100 angstroms. Furthermore, tunnel barrier layer 26 is described as a non-magnetic layer arranged between free ferromagnetic layer 24 and fixed ferromagnetic layer 45. In some cases, tunnel barrier layer 26 is formed of aluminum (Al) and oxygen (O). In such a case, tunnel barrier layer 26 may have a thickness, $t_3$, which is less than approximately 50 angstroms. Note, however, that the above thicknesses may depend on the material compositions of the different cell layers. As such, the above thicknesses are not restricted to the exemplary ranges presented above.

In an attempt to compensate for ferromagnetic coupling across tunnel barrier layer 26, fixed ferromagnetic layer 45 may be formed having a thickness substantially greater than the thickness of pinned ferromagnetic layer 49, in some cases. More specifically, SAF stack 42 may be formed as an "unbalanced" stack, such that thickness $t_2$ is substantially greater than thickness $t_1$. In one example, $t_2$ is approximately 20 angstroms, ti is approximately 17 angstroms, and $t_3$ is approximately 15 angstroms. In other examples, however, the thickness of layers 49, 45, and 26 (i.e., $t_1$, $t_2$, and $t_3$, respectively) may fall anywhere within the ranges provided above.

In general, including unbalanced SAF stack 42 within a memory cell may increase the write selectivity of a memory circuit by compensating for topological (i.e., ferromagnetic) positive coupling, thereby reducing the effects of processing differences between individual memory cells of the circuit. In particular, ferromagnetic coupling may be reduced within individual memory cells by increasing the thickness of fixed ferromagnetic layer 45 with respect to the thickness of pinned ferromagnetic layer 49. As such, increasing the thickness of fixed ferromagnetic layer 45 produces a biasing (e.g., negative) magnetic field, which attempts to counteract the positive offset caused by ferromagnetic coupling. Unfortunately, such a biasing magnetic field may not be uniform in a particular layer within all cells of a memory circuit, due to variations in layer thicknesses between individual memory cells. As such, it is often difficult to substantially eliminate ferromagnetic coupling in such a manner, due to the difficulty in maintaining a substantially equal thickness in the particular layer between individual memory cells. Consequently, such an approach may not entirely compensate for ferromagnetic coupling, and thus, unequal thresholds of writing current may still exist.

As stated above, individual layers within an MRAM cell typically exhibit some degree of surface roughness that generally introduces a positive offset into the resistance verses applied current response (e.g., see R-I curve of FIG. 2B). Therefore, an alternative approach to reducing ferromagnetic coupling is to adjust the roughness of one cell layer (e.g., pinned ferromagnetic layer 49) relative to the roughness of another cell layer (e.g., fixed ferromagnetic layer 45). Such an adjustment of roughness may produce a biasing magnetic field, which also attempts to re-center the R-I curve by counteracting the positive offset caused by ferromagnetic coupling. In one example, the roughness of pinned ferromagnetic layer 49 may be adjusted by altering the thickness of layer 49 relative to the thickness of fixed ferromagnetic layer 45. In such an example, the thickness of layer 49 may be increased or decreased until the roughness of layer 49 is substantially greater than the roughness of layer 45. In another example, ion bombardment may be used to increase the roughness of pinned ferromagnetic layer 49, or alternatively, to decrease the roughness of fixed ferromagnetic layer 45. In yet another example, the roughness may be adjusted by depositing a small amount of additional material between pinned ferromagnetic layer 49 and the fixed ferromagnetic layer 45 to thereby increase the roughness of pinned ferromagnetic layer 49.

In general, varying the roughness (i.e., altering the surface topology) of one or more layers within SAF stack 42 may increase the write selectivity of a memory circuit by reducing the effects of processing differences between individual memory cells of the circuit. In particular, varying the roughness of the one or more cell layers may reduce the magnetic coupling between the magnetic poles created by uneven surface topology. However, magnetic memory cells (e.g., MRAM cells) typically include very thin cell layers, some of which are tens of angstroms thick. As such, it is often difficult to substantially eliminate ferromagnetic coupling in such a manner, due to the difficulty in controlling the surface topology of the thin cell layers.

Figure 2D:
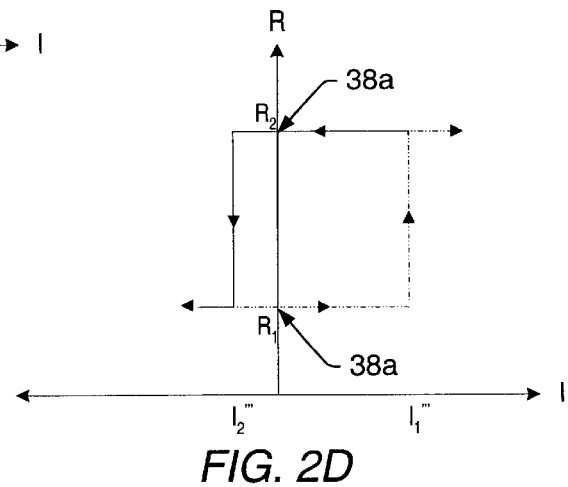
FIG. 2D is a graph illustrating a substantially uncentered resistance versus applied current response.

Therefore, FIG. 2D illustrates that the above techniques (i.e., varying the thickness and/or roughness of one or more cell layers within SAF stack 42) may still produce an offset (e.g., a positive offset) in the resistance versus applied current response within one or more memory cells of the circuit. Though such a positive offset may allow a memory cell to maintain two substantially different magnetic states at rest (reference numerals 38a and 38b), an offset of any amount may still produce unequal thresholds of writing current. For example, FIG. 2D shows that the magnitude of current ($|I_1'''|$) needed to switch the magnetization from a low to high resistance state is significantly greater than the magnitude of current ($|I_2'''|$) needed to switch the magnetization from a high to low resistance state. Therefore, the techniques described above generally do not optimize the write selectivity between individual memory cells of the circuit.

Thus, it may be advantageous to provide a magnetic memory cell and method, which does not rely on eliminating an offset in the resistance versus applied current response to compensate for unintentional magnetic coupling. Instead, the magnetic memory cell and method described herein optimizes write selectivity within the memory circuit and maintains proper operating characteristics at rest, even in the presence of ferromagnetic and/or antiferromagnetic coupling. In some embodiments, the magnetic memory cell may include a configuration as described above in reference to FIG. 3. In other embodiments, however, it may be advantageous to provide a method that optimizes the write selectivity of a memory circuit, which includes alternative configurations of magnetic memory cells. Such alternative configurations are described below in reference to FIGS. 4 and 5.

In general, the memory cells of FIGS. 4 and 5 may include some, if not all, of the cell layers described above in reference to FIG. 3. For example, the memory cells of FIGS. 4 and 5 may include top electrode 40, free ferromagnetic layer 24, tunnel barrier layer 26, SAF stack 42, antiferromagnetic layer 44, seed layer 46, and bottom electrode 48. As such, the individual cell layers of FIGS. 4 and 5 may include the same or, alternatively, different material compositions than those described above in FIG. 3. In other examples, however, one or more cell layers within SAF stack 42 may not be included within the memory cells of FIGS. 4 and 5, such as fixed ferromagnetic layer 45 and coupling layer 47. In such an example, pinned ferromagnetic layer 49 may be arranged between tunnel barrier layer 26 and antiferromagnetic layer 44.

In particular, FIGS. 4 and 5 illustrate alternative embodiments in which the magnetic memory cell described herein includes an upper portion having a lateral width that is substantially smaller than a lateral width of a lower portion of the memory cell. In addition, though not explicitly illustrated in FIGS. 4 and 5, the magnetic memory cell may further include an upper portion having a lateral length that is substantially smaller than a lateral length of a lower portion of the memory cell. As such, the width of the memory cell may be arranged in a dimension parallel to the page, whereas the length of the memory cell may be arranged in a dimension perpendicular to the page. In any case, a substantially smaller lateral width and/or lateral length may be achieved, for example, by including at least two etching steps in the memory cell fabrication process. For instance, the lower portion may be formed during a first etching step prior to forming the upper portion during a second etching step. Alternatively, the upper portion may be formed during a first etching step prior to forming the lower portion during a second etching step. In either embodiment, the first and second etching steps may be implemented using any wet or dry etching technique commonly used in the semiconductor manufacturing industry.

In this manner, the magnetic memory cells of FIGS. 4 and 5 indicate that the upper and lower portions may be fabricated, such that a sidewall surface of the upper portion is misaligned, or offset, from a sidewall surface of the lower portion. In some cases, however, the amount of offset (reference numerals 50 and 52 of FIGS. 4 and 5, respectively) may differ from cell to cell causing overlay variations between individual memory cells of the circuit. In general, overlay variations may refer to the differences between individual memory cells with regard to the arrangement of the upper portion of the memory cell relative to the lower portion of the memory cell. In particular, it may be desirable to arrange the upper portion upon the lower portion of the memory cell, such that the upper portion is approximately centered along the length and/or width dimensions of the lower portion of the memory cell.

In some cases, for example, when SAF layer 42 is unbalanced (i.e., when layers 45 and 49 have substantially different thicknesses), overlay variation may modify the magnetic field strength (i.e., switching field) needed to switch the magnetic direction of free ferromagnetic layer 24. In such a case, overlay variations between individual memory cells may affect the write selectivity of the memory circuit. For example, FIG. 4 depicts a magnetic memory cell configuration that is adversely affected by overlay variation. In particular, FIG. 4 includes an upper portion comprising top electrode 40 and free ferromagnetic layer 24. In addition, FIG. 4 includes a lower portion comprising tunnel barrier layer 26, SAF stack 42, antiferromagnetic layer 44, seed layer 46, and bottom electrode 48. In this manner, overlay variations between free ferromagnetic layer 24 (within the upper portion) and fixed ferromagnetic layer 45 (within the lower portion) may increase or decrease the switching field of one or more memory cells, thereby affecting the write selectivity of the memory circuit.

For example, free magnetic layer 24 may experience magnetic fringe fields (which originated from the ends of the layers within SAF stack 42) that vary depending on the position of free magnetic layer 24 with respect to SAF stack 42. In this manner, the switching field of free magnetic layer 24 may be relatively stronger when the overlay variation between free magnetic layer 24 and SAP stack 42 is small, and relatively weaker when the overlay variation between free magnetic layer 24 and SAF stack 42 is large. Thus, overlay variation within a memory cell having an unbalanced SAF stack and a configuration as illustrated in FIG. 4 may cause the switching field to vary depending on where the upper portion is arranged upon the lower portion of the memory cell.

Aside from the problems introduced by overlay variation, however, including offset 50 in the memory cell may advantageously prevent electrical shorting between free ferromagnetic layer 24 and fixed ferromagnetic layer 45. For example, electrical shorting between layers 24 and 45 may occur due to the deposition of a conductive material on the sidewall surface of the memory cell during the etching process. A memory cell having a configuration as described in FIG. 4, however, may prevent electrical shorting between layers 24 and 45 since the sidewall surfaces of layer 24 are separated from the sidewall surfaces of layer 45 by an uppermost surface of tunnel barrier layer 26.

In other cases, overlay variation may not affect the switching field of free magnetic layer 24. For example, FIG. 5 depicts a magnetic memory cell configuration that is substantially unaffected by overlay variations between individual memory cells. In particular, FIG. 5 includes an upper portion comprising top electrode 40, free ferromagnetic layer 24, tunnel barrier layer 26 and SAF stack 42. In addition, FIG. 5 includes a lower portion comprising anti-ferromagnetic layer 44, seed layer 46, and bottom electrode 48. In this manner, the switching field of the magnetic memory cell is substantially unresponsive to overlay variations between the upper and lower portions, since free ferromagnetic layer 24 and fixed ferromagnetic layer 45 are both arranged within the upper portion of the cell, and thus, have similar lateral widths and/or similar lateral lengths. Though the magnetic memory cell of FIG. 5 is substantially unaffected by overlay variations, the offset produced in such a configuration (e.g., offset 52) may not prevent electrical shorting between free ferromagnetic layer 24 and fixed ferromagnetic layer 45.

Figure 6:
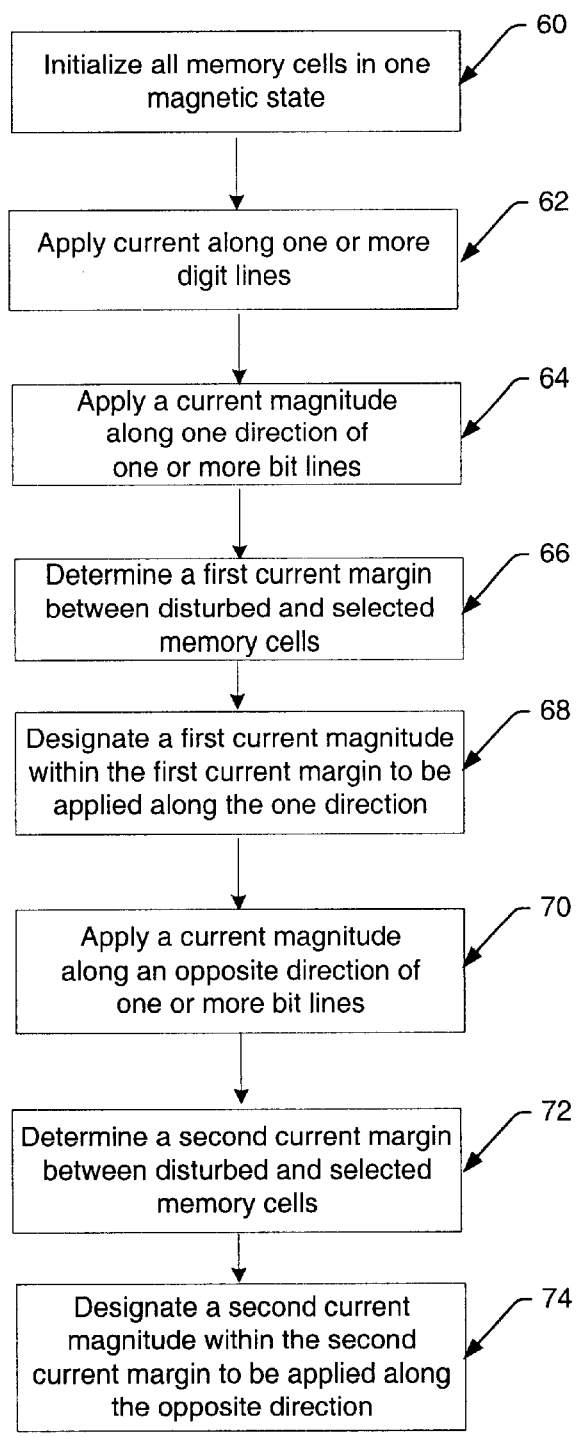
FIG. 6 is a flowchart depicting an exemplary method for assigning current magnitudes for write operations in a magnetic memory cell array, such as the array shown in FIG. 1.

FIG. 6 illustrates one embodiment of a method, which significantly increases the write selectivity between individual memory cells, such as the magnetic memory cells depicted in FIGS. 3–5. In general, the method of FIG. 6 increases the write selectivity of a circuit by compensating for the differences between individual memory cells. In particular, the method may be used to increase the write selectivity in cells that include a balanced, an unbalanced, or no SAF stack. In addition, the method may be used to increase the write selectivity in cells that are affected by overlay variation, as well as in cells that are substantially unaffected by overlay variation. Furthermore, the method may be used to increase the write selectivity in cells having layers with substantially even or uneven surface topologies, or in cells having non-zero total magnetic moments within the fixed and pinned magnetic layers. Thus, the method provided herein does not attempt to re-center the resistance versus applied current response by altering the configuration of the magnetic memory cell. Instead, the method provides significantly increased write selectivity between individual cells having either a relatively centered or uncentered resistance versus applied current response.

A preferred method of assigning tunable current magnitudes for write operations in a magnetic memory cell is described below in reference to FIGS. 1, 6, and 7. Generally speaking, the method tests a plurality of selected and disturbed memory cells in a magnetic memory array to determine the appropriate write operation current magnitudes to be applied along opposing directions of the magnetic memory array. In step 60 of FIG. 6, the method may begin by initializing all memory cells within the array to a single magnetic state (i.e., all cells exhibit an identical magnetic direction in free magnetic layer 24). Since the initialization step is generally performed to simplify the detection of switched cells, it may not be necessary to always include such a step in the method. The method may continue by applying current having a fixed magnitude and direction along one or more digit lines (step 62). Subsequently, the method may apply a tunable current magnitude along one direction of one or more bit lines (step 64) to determine a first current margin between disturbed and selected memory cells (step 66). Such a step of determining a first current margin is described in more detail below in reference to FIG. 7. Next, the method may include designating a first current magnitude within the first current margin to be applied along the one direction (step 68).

As such, the method described herein ultimately assigns tunable current magnitudes for write operations in magnetic memory cells arranged along selected bit lines. In other cases, however, the method may provide tunable current magnitudes along selected digit lines. For example, the current having a fixed magnitude and direction may be applied along one or more bit lines (alternative step 62), while the tunable current magnitude may be applied along the one direction of one or more digit lines (alternative step 64). Thus, the method described herein may be used to determine write operation current magnitudes along bit lines, along digit lines, or along both bit lines and digit lines. For the sake of simplicity, however, the method is described below for assigning tunable write operation currents along selected bit lines.

As stated above, current may be applied to one or more bit lines, such as bit line 11 and bit line 13 in FIG. 1. Note, however, that it may not be necessary to choose neighboring bit lines. Instead, the one or more bit lines may be randomly chosen from the plurality of bit lines within the memory circuit. In some cases, it may be desirable to apply current to a plurality of conductive lines. Such a case may increase the probability that the assigned current magnitudes will result in accurate write operations within substantially all selected memory cells. In some cases, substantially all bit lines may be chosen for testing purposes. However, such an embodiment is not typically used due to time constraints. Thus, current may alternatively be applied to a number of bit lines, which is less than the total number of bit lines in the circuit. For the sake of simplicity, the method is described below for assigning tunable write operation currents along selected bit lines 11 and 13, as shown in FIG. 1.

In the exemplary embodiment of FIG. 1, the current applied along the one or more digit lines is applied along digit line 14 (in direction 25). In addition, the current magnitude applied along the one or more bit lines is applied along selected bit line 11 and selected bit line 13 (in direction 20). As such, a write operation may occur in one or more selected memory cells (e.g., memory cells 18 and 22) corresponding to selected bit lines 11 and 13, and selected digit line 14. Next, a first current margin of the current applied along the one or more bit lines is determined between a disturbed memory cell and a selected memory cell (step 66 of FIG. 6). Such a current margin is described herein as the difference between a minimum current value needed to switch a disturbed memory cell of the circuit and a maximum current value needed to switch a selected memory cell of the circuit. In general, the minimum current value needed to switch a disturbed memory cell may be described herein as the current value responsible for switching substantially one memory cell, which was not intended for a write operation. On the other hand, the maximum current value needed to switch a selected memory cell may be described herein as the minimum amount of current needed to switch substantially all memory cells intentionally selected for a write operation.

Figure 7:
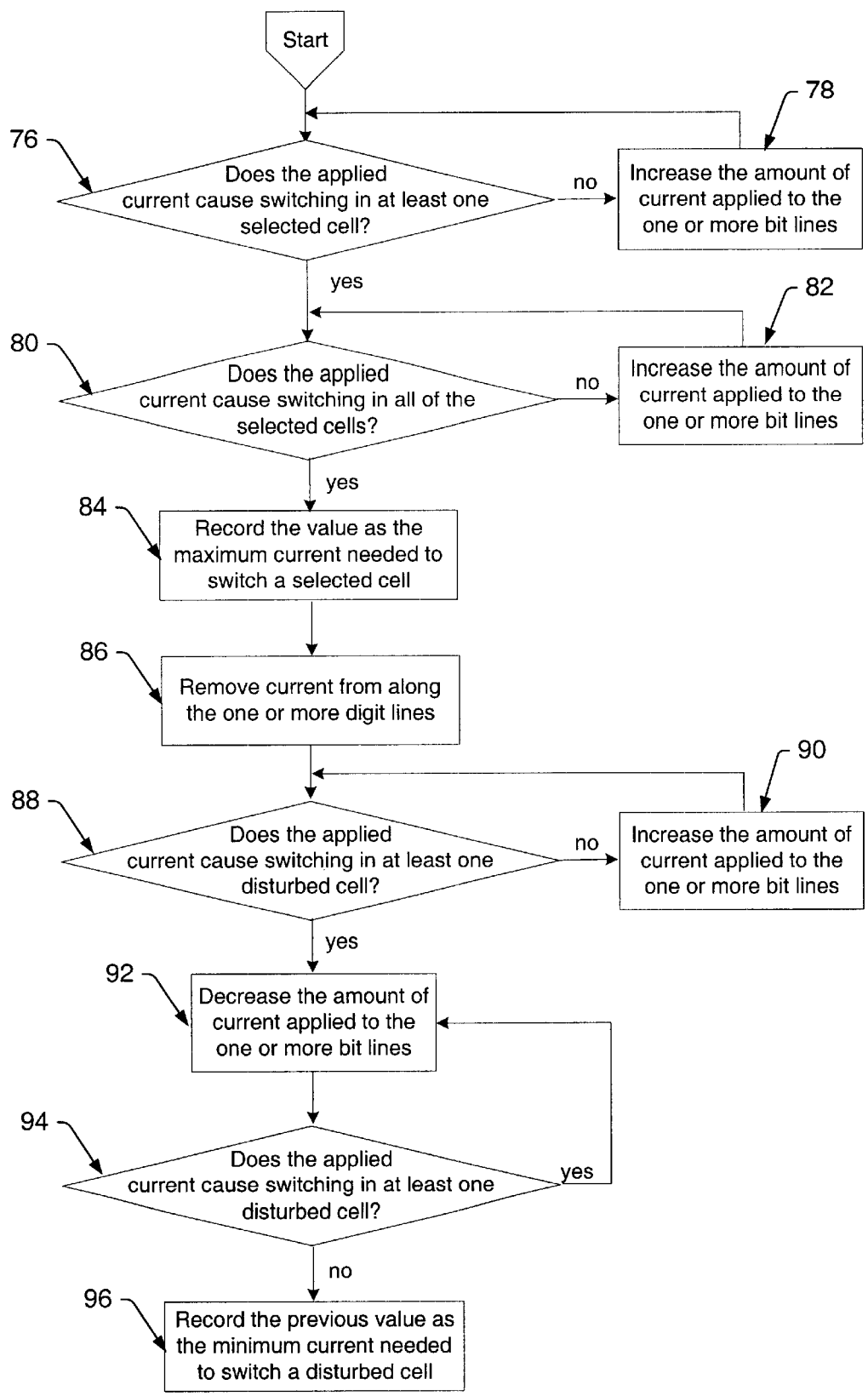
FIG. 7 is a flowchart depicting an exemplary method for determining a current margin between a disturbed memory cell and a selected memory cell.

FIG. 7 illustrates one embodiment of a method for determining the first current margin alluded to in the method of FIG. 6. In the case that the applied current (along the one or more bit lines and digit lines) is not sufficient to switch at least one selected memory cell (step 76), the current applied to the one or more bit lines is subsequently increased by an incremental amount (step 78). In some cases, the incremental amount may fall within a range of about 0.01 mA to about 1.0 mA. In a specific example, the current may be increased by an incremental amount of about 0.1 mA. In other cases, substantially any incremental amount may be used, however, the accuracy of the testing procedure may be directly related to the chosen incremental amount. Returning to step 76, the current applied to the one or more bit lines may be gradually increased until the current causes at least one selected memory cell to switch magnetic states.

If the applied current causes at least one selected memory cell to switch (step 76), step 80 determines whether or not the applied current causes switching in substantially all of the selected memory cells. Referring to the exemplary embodiment of FIG. 1, step 80 determines whether or not the currents applied along bit lines 11 and 13 (in combination with the current applied along digit line 14) cause both selected memory cell 18 and selected memory cell 22 to switch. If all selected memory cells are not switched (step 80), the current applied along the two or more bit lines is increased by an incremental amount (step 82). As stated above, the incremental amount may fall within a range of about 0.01 mA to about 1.0 mA, but may preferably be about 0.1 mA. In this manner, the applied bit line current may be repeatedly increased until the amount of current applied along the selected bit lines causes substantially all selected memory cells to switch.

In some cases, the applied current may be increased (step 82) along substantially all selected bit lines (e.g., bit lines 11 and 13). In other cases, however, the applied current may be increased (step 82) along only the bit line(s) corresponding to the one or more selected memory cells that were not previously switched in step 80. For example, if the applied current causes only selected memory cell 18 to switch, the applied current may be increased along bit line 11, but left substantially unchanged along bit line 13. In either embodiment, the above procedure ultimately determines a range of currents corresponding to the minimum current values needed to switch the selected memory cells. Therefore, a maximum current value needed to switch substantially all selected memory cells may be chosen as the largest value within the range of minimum current values needed to switch the selected memory cells. The chosen maximum current value is recorded in step 84 as the maximum current value needed to switch a selected cell of the magnetic memory circuit.

FIG. 7 also determines the minimum current value needed to switch a disturbed cell of the magnetic memory circuit. In order to determine the minimum current value, current may be removed along the one or more digit lines (step 86) to find the current margin for disturbed cells arranged along the selected bit lines. Alternatively, it may not be necessary to include step 86, such that a minimum current magnitude may also be found for disturbed cells arranged along the one or more digit lines. Next, step 88 determines whether or not the applied current causes switching in at least one disturbed cell. Referring to the exemplary embodiment of FIG. 1, a disturbed cell may be arranged along selected bit line 11 (e.g., memory cells 21 and 23) or along selected bit line 13 (e.g., memory cells 17 and 19). In some cases, a disturbed cell may also be arranged along selected digit line 14. If the applied current fails to cause at least one disturbed cell to switch, the applied current is subsequently increased by an incremental amount (step 90). As stated above, the incremental amount may be determined based on the desired accuracy of the testing procedure. In some cases, the incremental amount may fall within a range of about 0.01 mA to about 1.0 mA, but may preferably be about 0.1 mA.

If, however, the applied current causes at least one disturbed cell to switch, the applied current is subsequently decreased by an incremental amount (step 92). The purpose of decreasing the current is to ensure that a minimum current value is determined for switching any disturbed cell within the magnetic memory circuit. For example, the applied current may be increased in a previous step (step 90) by an amount that causes switching in more than one disturbed cell; however, the applied current may not truly represent the minimum current needed to switch substantially one (or the easiest) disturbed cell. For this reason, the incremental amount used in decreasing the applied current (step 92) is generally smaller than the incremental amount used in increasing the applied current (steps 90). In some cases, for example, the incremental amount used in decreasing the applied current may fall within a range of about 0.005 mA to about 0.5 mA. Preferably, the incremental amount used in decreasing the applied current is about 0.01 mA. In this manner, the applied current may be repeatedly decreased until the amount of current applied along the one or more selected bit lines ceases to cause any of the disturbed cells to switch (steps 92 and 94). At this point, the previously applied current value is recorded as the minimum current value needed to switch a disturbed cell of the magnetic memory circuit (step 96). Thus, the first current margin is generally bounded by the maximum current value needed to switch a selected cell (step 84) and the minimum current value needed to switch a disturbed cell (step 96). Therefore, a first current magnitude chosen within the first current margin (step 68 of FIG. 6) can be assigned for write operations along a first direction of the plurality of bit lines.

In addition, a method of assigning a second current magnitude for write operations along an opposite direction of the plurality of bit lines is provided in steps 70–74 of FIG. 6. In one embodiment, the method of assigning a second current magnitude may be conducted simultaneously with the method of assigning a first current magnitude. For example, steps 70–74 may be conducted simultaneously with steps 62–68, such that step 70 is conducted at the same time as step 62. In such an embodiment, a set of the plurality of bit lines may be randomly chosen to receive current along a first direction, as described above in step 64. At the same time, a substantially different set of the plurality of bit lines may be randomly chosen to simultaneously receive current along the opposite direction. In another embodiment, however, the method of assigning a second current magnitude may be conducted consecutively with the method of assigning a first current magnitude. In some cases, a set of randomly chosen bit lines may receive current along the one direction prior to a substantially different set of randomly chosen bit lines receiving current along the opposite direction. In other cases, however, a single set of randomly chosen bit lines may receive current along the one direction prior to receiving current along the opposite direction of the same set of bit lines. Such a case is represented in both FIGS. 1 and 6.

As shown FIG. 6, for example, a current magnitude may be applied along an opposite direction of one or more bit lines (step 70). As stated above, the one or more bit lines may be substantially different from the one or more bit lines used to determine the first current magnitude. Alternatively, and in the example described below, the one or more bit lines are substantially identical to the one or more bit lines used to determine the first current magnitude. In such an example, a current magnitude may be applied along an opposite direction of bit lines 11 and 13, (as indicated in FIG. 1 by dashed lines 30) after performing steps 60–68 of the method of FIG. 6. Next, a second current margin of the current applied along the opposite direction is determined between a disturbed memory cell and a selected memory cell (step 72). The step of determining a second current margin (step 72) is generally conducted in a manner similar to the step of determining the first current margin (step 66). As such, the second current margin may be determined by following steps 76–96, as described above in reference to FIG. 7. Finally, a second current magnitude chosen within the second current margin (step 74) can be assigned for write operations along the opposite direction of the plurality of bit lines.

In this manner, the first current magnitude may be chosen or "tuned" for write operations along one direction of a plurality of parallel conductive lines, such as, e.g., a plurality of bit lines. In addition, the second current magnitude may be separately chosen or "tuned" for write operations along an opposite direction of the plurality of parallel conductive lines. Note that the term "separately chosen" is used herein to describe the value chosen for the second current magnitude as being substantially unaffected by the value chosen for the first current magnitude. As such, the first current magnitude represents a tunable current magnitude for write operations along the one direction, while the second current magnitude represents a tunable current magnitude for write operations along the opposite direction of a plurality of parallel conductive lines. In some cases, the second current magnitude may be substantially identical to the first current magnitude. In other cases, however, the second current magnitude may be substantially different from the first current magnitude, due to variations in the cell fabrication process or other irregularities existing between individual cells within a magnetic memory circuit.

In some cases, the above method produces current margins greater than approximately 1.0 mA for magnetic memory cells, such as MRAM cells. In such a case, a current difference (i.e., a current margin) of 1.0 mA exists between the amount of current needed to switch a selected memory cell and the amount of current responsible for switching a disturbed memory cell. Such a current margin advantageously increases the write selectivity of the memory circuit by reducing the occurrence of false write operations within disturbed cells of the memory circuit. In other cases, however, the current margins may be slightly less than 1.0 mA, or alternatively, may be significantly greater than 1.0 mA. For example, a current margin may be determined within a range of about 0.8 mA and about 2.5 mA. In such an example, a current difference of 2.5 mA may exist between the amount of current needed to switch a selected memory cell and the amount of current responsible for switching a disturbed memory cell.

In addition, the first and second current magnitudes may be chosen as the midpoints of the first and second current margins, respectively. For example, if the first and second current margins include current values ranging between approximately 3.0 mA to approximately 5.0 mA, a midpoint value of 4.0 mA may be chosen for the first and second current magnitudes. As stated above, it may not be necessary for the first and second current magnitudes to be substantially equal. Therefore, a first current magnitude representing a midpoint value of the first current margin may be substantially different from a second current magnitude representing a midpoint value of the second current margin. In other cases, however, the first and second current magnitudes may be chosen anywhere within the first and second current margins, respectively.

Figure 8:
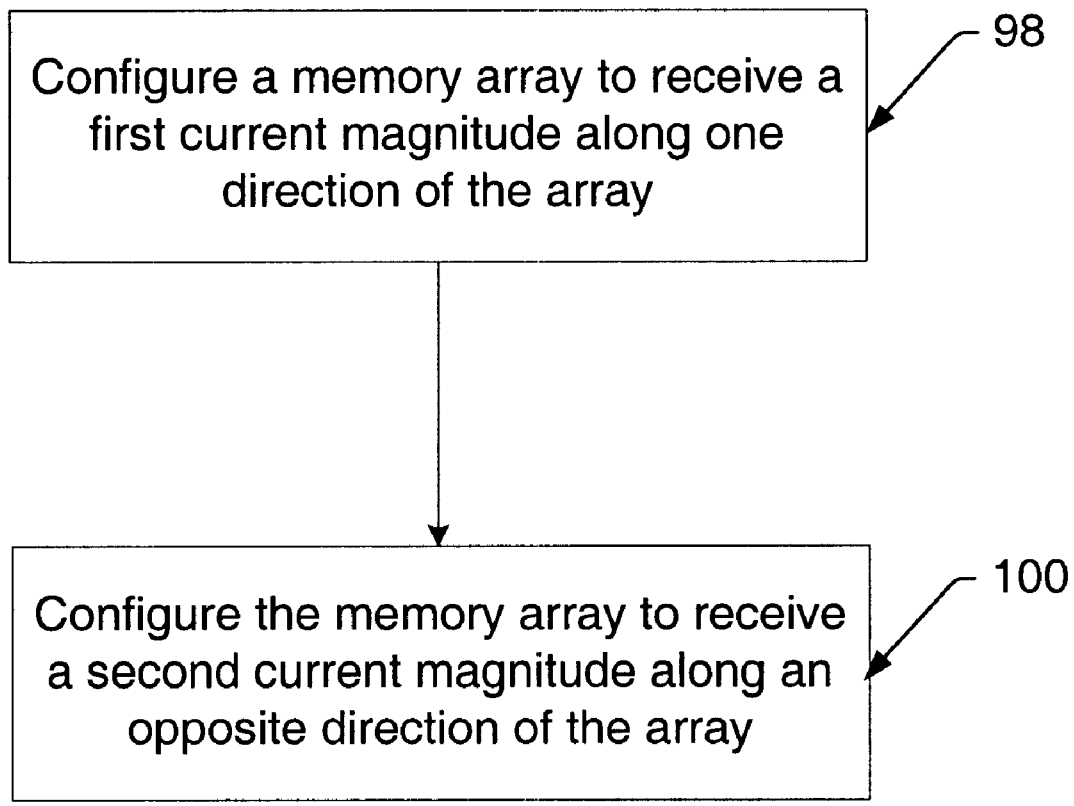
FIG. 8 is a flowchart depicting an exemplary method for configuring a device having a magnetic memory array.

FIG. 8 illustrates a method for configuring a device having a magnetic memory array. The method may include configuring the device to receive a first current magnitude along one direction of the magnetic memory array (step 98). In addition, the method may further include configuring the device to receive a second current magnitude along an opposite direction of the magnetic memory array (step 100). Such configuring (steps 98 and 100) may be conducted, for example, in a device including a means to alter the amount of current applied to the conductive lines of the magnetic memory array. In some embodiments, such means may include a plurality of fuse/resistor pairs arranged between the conductive lines of the memory array and a power source coupled to the memory array. A set of the plurality of fuse/resistor pairs may be placed in series with each of the conductive lines in the memory array. In this manner, the amount of current applied to a particular conductive line may be altered by systematically blowing one or more fuses coupled to that line. As such, the current path may be redirected through the one or more resistors of the blown fuse/resistor pairs to modify the amount of current applied to the particular conductive line. Note, however, that the method of configuring such a device is not restricted to the exemplary embodiment described above, and may be configured by any means in which current applied to the conductive lines may be altered.

In some cases, the second current magnitude may be substantially different from the first current magnitude. In other cases, however, the second current magnitude may be substantially equal to the first current magnitude. In any case, the first and second current magnitudes include write operation current magnitudes for the magnetic memory array. As such, the method may include configuring the device to receive the first and second current magnitudes along a bit line or, alternatively, along a digit line of the device. In addition, the method may include configuring the device to receive the first and second current magnitudes along both a bit line and a digit line of the device. Therefore, the method provides tunable writing currents along either the bit line, the digit line, or along both the bit line and the digit line.

It will be appreciated to those skilled in the art having the benefit of this disclosure that this invention is believed to provide a magnetic memory cell array and a method for assigning tunable current magnitudes for write operations within memory cells of the magnetic memory cell array. Further modifications and alternative embodiments of various aspects of the invention will be apparent to those skilled in the art in view of this description. For example, though the above description included only magnetic memory cells, such as MRAM cells, the method may also be incorporated using any type of magnetic memory cell. Therefore, it is intended that the following claims be interpreted to embrace all such modifications and changes and, accordingly, the specification and drawings are to be regarded in an illustrative rather than a restrictive sense.

What is claimed is:

1. A circuit adapted to:
   supply current at a first magnitude along one direction of a conductive line arranged within the circuit; and
   supply current at a second magnitude along an opposite direction of the conductive line, wherein the first and second current magnitudes are different.

2. The circuit of claim 1, wherein the conductive line is a bit line.

3. The circuit of claim 1, wherein the conductive line is a digit line.

4. The circuit of claim 1, further adapted to supply the first and second magnitude currents to a plurality of other conductive lines aligned with the conductive line.

5. The circuit of claim 1, further adapted to compensate for a non-centered resistance versus current response produced by unintentional magnetic coupling within magnetic memory cells of the circuit.

6. The circuit of claim 1, further adapted to produce a current margin greater than or equal to approximately 0.8 mA, wherein the current margin is the difference between a minimum current value needed to switch a disturbed memory cell of the circuit and a maximum current value needed to switch a selected memory cell of the circuit.

7. The circuit of claim 6, further adapted to produce a current margin between about 0.8 mA and about 2.5 mA.

8. The circuit of claim 1, comprising a magnetic memory cell adapted to:
   maintain a first magnetic direction within a first magnetic layer of the magnetic memory cell;
   maintain a second magnetic direction within a second magnetic layer of the magnetic memory cell, wherein the second magnetic direction is opposite to the first magnetic direction; and
   change a third magnetic direction within a third magnetic layer of the magnetic memory cell.

9. The circuit of claim 8, wherein the first magnetic layer and the second magnetic layer comprise substantially similar thicknesses.

10. The circuit of claim 8, wherein the first magnetic layer and the second magnetic layer comprise substantially different thicknesses.

11. The circuit of claim 8, wherein the third magnetic layer comprises a narrower width than widths of the first and second magnetic layers.

12. A method for configuring a device having a magnetic memory array, comprising:
    configuring the device to receive a first current magnitude along one direction of the magnetic memory array; and
    configuring the device to receive a second current magnitude along an opposite direction of the magnetic memory array, wherein the second current magnitude is substantially different from the first current magnitude.

13. The method of claim 12, wherein the first and second current magnitudes comprise write operation current magnitudes for the magnetic memory array.

14. The method of claim 12, wherein said steps of configuring the device to receive the first and second current magnitudes comprise configuring the device to receive the first and second current magnitudes along both a bit line and a digit line of the device.

15. A method of assigning current magnitudes for write operations in a magnetic memory array, comprising:
    determining a first write operation current magnitude along one direction of a conductive line arranged within the magnetic memory array; and
    separately determining a second write operation current magnitude along an opposite direction of the conductive line, or alternatively, along an opposite direction of a second conductive line parallel to the conductive line.

16. The method of claim 15, wherein the second write operation current magnitude is different than the first write operation current magnitude.

17. The method of claim 15, wherein the second write operation current magnitude is substantially equal to the first write operation current magnitude.

18. The method of claim 15, wherein the steps of determining the first write operation current magnitude and determining the second write operation current magnitude are conducted consecutively by utilizing the conductive line and/or the second conductive line.

19. The method of claim 15, wherein the steps of determining the first write operation current magnitude and determining the second write operation current magnitude are conducted simultaneously by utilizing the conductive line and the second conductive line.

20. The method of claim 15, wherein the step of determining the first write operation current magnitude comprises:
    determining a current margin between a write operation current magnitude of a disturbed memory cell and a write operation current magnitude of a selected memory cell for current applied along the one direction of the conductive line; and
    designating a current magnitude within the current margin to be applied along the one direction of the conductive line.

21. The method of claim 15, wherein the step of separately determining the second write operation current magnitude comprises:
    determining a current margin between a write operation current magnitude of a disturbed memory cell and a write operation current magnitude of a selected memory cell for current applied along the opposite direction of the conductive line; and
    designating a current magnitude within the current margin to be applied along the opposite direction of the conductive line.

* * * * *